US011010315B2

(12) United States Patent
Ambardekar et al.

(10) Patent No.: US 11,010,315 B2
(45) Date of Patent: May 18, 2021

(54) FLEXIBLE HARDWARE FOR HIGH THROUGHPUT VECTOR DEQUANTIZATION WITH DYNAMIC VECTOR LENGTH AND CODEBOOK SIZE

(71) Applicant: MICROSOFT TECHNOLOGY LICENSING, LLC, Redmond, WA (US)

(72) Inventors: Amol Ashok Ambardekar, Redmond, WA (US); Aleksandar Tomic, Dublin (IE); Chad Balling McBride, North Bend, WA (US); George Petre, Redmond, WA (US); Kent D. Cedola, Bellevue, WA (US); Larry Marvin Wall, Seattle, WA (US); Boris Bobrov, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 695 days.

(21) Appl. No.: 15/881,519

(22) Filed: Jan. 26, 2018

(65) Prior Publication Data
US 2018/0300603 A1    Oct. 18, 2018

Related U.S. Application Data

(60) Provisional application No. 62/486,432, filed on Apr. 17, 2017.

(51) Int. Cl.
G06F 13/16    (2006.01)
G06N 3/04    (2006.01)
(Continued)

(52) U.S. Cl.
CPC .......... G06F 13/1673 (2013.01); G06F 1/324 (2013.01); G06F 1/3275 (2013.01);
(Continued)

(58) Field of Classification Search
CPC .... G06F 13/1673; G06F 1/324; G06F 3/0604; G06F 3/0631; G06F 3/067; G06F 9/3887;
(Continued)

(56) References Cited

U.S. PATENT DOCUMENTS 4,298,954 A    11/1981    Bigelow et al.
5,091,864 A    2/1992    Baji et al.
(Continued)

FOREIGN PATENT DOCUMENTS

EP    0147857 A2    7/1985
EP    2945290 A2    11/2015
(Continued)

OTHER PUBLICATIONS

"Non Final Office Action Issued in U.S. Appl. No. 15/702,311", dated Jun. 29, 2018, 10 Pages.
(Continued)

Primary Examiner — Kyoung Lee
(74) Attorney, Agent, or Firm — Newport IP, LLC; Han Gim

(57) ABSTRACT

The performance of a neural network (NN) and/or deep neural network (DNN) can limited by the number of operations being performed as well as memory data management of a NN/DNN. Using vector quantization of neuron weight values, the processing of data by neurons can be optimize the number of operations as well as memory utilization to enhance the overall performance of a NN/DNN. Operatively, one or more contiguous segments of weight values can be converted into one or more vectors of arbitrary length and each of the one or more vectors can be assigned an index. The generated indexes can be stored in an exemplary vector quantization lookup table and retrieved by exemplary fast weight lookup hardware at run time on the flyas part of an exemplary data processing function of the NN as part of
(Continued)

an inline de-quantization operation to obtain needed one or more neuron weight values.

22 Claims, 9 Drawing Sheets

(51) Int. Cl.

| | |
|---|---|
| G06N 3/063 | (2006.01) |
| G06F 12/0862 | (2016.01) |
| G06F 9/46 | (2006.01) |
| G06F 1/324 | (2019.01) |
| G06F 3/06 | (2006.01) |
| G06F 9/38 | (2018.01) |
| G06F 12/08 | (2016.01) |
| G06F 12/10 | (2016.01) |
| G06F 15/80 | (2006.01) |
| G06F 17/15 | (2006.01) |
| G06N 3/06 | (2006.01) |
| G06N 3/08 | (2006.01) |
| G06N 3/10 | (2006.01) |
| H03M 7/30 | (2006.01) |
| H04L 12/715 | (2013.01) |
| H04L 29/08 | (2006.01) |
| G06F 1/3234 | (2019.01) |
| G06F 12/02 | (2006.01) |
| G06F 13/28 | (2006.01) |
| H03M 7/46 | (2006.01) |
| H04L 12/723 | (2013.01) |

(52) U.S. Cl.
CPC ............ *G06F 3/0604* (2013.01); *G06F 3/067* (2013.01); *G06F 3/0631* (2013.01); *G06F 9/3887* (2013.01); *G06F 9/46* (2013.01); *G06F 12/0207* (2013.01); *G06F 12/08* (2013.01); *G06F 12/0862* (2013.01); *G06F 12/10* (2013.01); *G06F 13/1689* (2013.01); *G06F 13/28* (2013.01); *G06F 15/8007* (2013.01); *G06F 17/15* (2013.01); *G06N 3/04* (2013.01); *G06N 3/049* (2013.01); *G06N 3/0454* (2013.01); *G06N 3/06* (2013.01); *G06N 3/063* (2013.01); *G06N 3/0635* (2013.01); *G06N 3/08* (2013.01); *G06N 3/10* (2013.01); *H03M 7/6005* (2013.01); *H03M 7/6011* (2013.01); *H03M 7/70* (2013.01); *H04L 45/04* (2013.01); *H04L 67/02* (2013.01); *H04L 67/1002* (2013.01); *G06F 2209/484* (2013.01); *G06F 2209/485* (2013.01); *G06F 2212/657* (2013.01); *H03M 7/46* (2013.01); *H04L 45/50* (2013.01); *Y02D 10/00* (2018.01)

(58) Field of Classification Search
CPC ...... G06F 12/08; G06F 12/10; G06F 15/8007; G06F 17/15; G06F 12/0862; G06F 9/46; G06F 1/3275; G06F 12/0207; G06F 13/1689; G06F 13/28; G06F 9/5033; G06F 2212/657; G06F 2209/485; G06F 2209/484; G06F 1/3287; G06F 1/3206; G06F 9/4881; G06F 9/5061; G06F 9/5016; G06F 9/467; G06F 2212/1016; G06F 2212/6026; G06F 9/5077; G06N 3/049; G06N 3/06; G06N 3/0635; G06N 3/08; G06N 3/10; G06N 3/0454; G06N 3/04; G06N 3/063; H03M 7/6005; H03M 7/6011; H03M 7/70; H03M 7/6058; H03M 7/3059; H03M 7/3066; H03M 7/46; H04L 45/04; H04L 67/02; H04L 67/1002; H04L 45/50; Y02D 10/00; Y02D 30/50

See application file for complete search history.

(56) References Cited

U.S. PATENT DOCUMENTS

| | | | |
|---|---|---|---|
| 5,487,153 A | 1/1996 | Hammerstrom et al. | |
| 5,524,175 A | 6/1996 | Sato et al. | |
| 5,644,749 A | 7/1997 | Obayashi | |
| 5,859,990 A | 1/1999 | Yarch | |
| 5,933,654 A | 8/1999 | Galdun et al. | |
| 6,307,867 B1 | 10/2001 | Roobol et al. | |
| 6,654,730 B1 | 11/2003 | Kato et al. | |
| 6,785,239 B1 | 8/2004 | Tasker | |
| 6,990,079 B2 | 1/2006 | Vrabel | |
| 7,012,893 B2 | 3/2006 | Bahadiroglu | |
| 7,480,640 B1 | 1/2009 | Elad et al. | |
| 7,539,608 B1 | 5/2009 | Dageville et al. | |
| 7,694,084 B2 | 4/2010 | Raghavan et al. | |
| 8,244,953 B1 | 8/2012 | Kumar | |
| 8,442,927 B2 | 5/2013 | Chakradhar et al. | |
| 8,892,488 B2 | 11/2014 | Qi et al. | |
| 8,966,413 B2 | 2/2015 | Shacham et al. | |
| 9,015,096 B2 * | 4/2015 | Hunzinger | G06N 3/049 706/45 |
| 9,143,393 B1 | 9/2015 | Bird et al. | |
| 9,378,044 B1 | 6/2016 | Gaurav et al. | |
| 9,851,771 B2 | 12/2017 | Cooper et al. | |
| 9,990,307 B1 | 6/2018 | Patel et al. | |
| 10,275,001 B2 | 4/2019 | Kam et al. | |
| 2002/0133648 A1 | 9/2002 | Goudie et al. | |
| 2003/0065631 A1 | 4/2003 | Mcbride | |
| 2003/0120799 A1 | 6/2003 | Lahav et al. | |
| 2003/0200315 A1 | 10/2003 | Goldenberg et al. | |
| 2004/0187135 A1 | 9/2004 | Pronovost et al. | |
| 2005/0204189 A1 | 9/2005 | Akiba | |
| 2005/0216616 A1 | 9/2005 | Eldar et al. | |
| 2006/0047864 A1 | 3/2006 | Brokenshire et al. | |
| 2007/0145151 A1 | 6/2007 | Nakamura et al. | |
| 2008/0043742 A1 | 2/2008 | Pong et al. | |
| 2008/0052441 A1 | 2/2008 | Freking et al. | |
| 2008/0112438 A1 | 5/2008 | Ying et al. | |
| 2008/0313385 A1 | 12/2008 | Vijayakumar et al. | |
| 2008/0319933 A1 | 12/2008 | Moussa et al. | |
| 2009/0037697 A1 | 2/2009 | Ramani et al. | |
| 2009/0313195 A1 | 12/2009 | Mcdaid et al. | |
| 2010/0180100 A1 | 7/2010 | Lu et al. | |
| 2010/0257174 A1 | 10/2010 | Minuti | |
| 2010/0281192 A1 | 11/2010 | Rakib et al. | |
| 2011/0246722 A1 | 10/2011 | Taha et al. | |
| 2012/0130928 A1 | 5/2012 | Bell et al. | |
| 2012/0134449 A1 | 5/2012 | Chen et al. | |
| 2014/0046882 A1 | 2/2014 | Wood | |
| 2014/0181464 A1 | 6/2014 | Forsyth et al. | |
| 2014/0281221 A1 | 9/2014 | Wang et al. | |
| 2014/0372670 A1 | 12/2014 | Vasilyuk | |
| 2015/0363239 A1 | 12/2015 | Hsu et al. | |
| 2016/0098388 A1 | 4/2016 | Blevins et al. | |
| 2016/0184587 A1 | 6/2016 | Heuvel et al. | |
| 2016/0267377 A1 | 9/2016 | Pan et al. | |
| 2016/0328644 A1 | 11/2016 | Lin et al. | |
| 2016/0335119 A1 | 11/2016 | Merrill et al. | |
| 2016/0350653 A1 | 12/2016 | Socher et al. | |
| 2017/0011288 A1 | 1/2017 | Brothers et al. | |
| 2017/0199902 A1 | 7/2017 | Mishra et al. | |
| 2018/0260711 A1 * | 9/2018 | Zhang | G06N 3/0481 |
| 2018/0299943 A1 | 10/2018 | Mcbride et al. | |
| 2018/0300601 A1 | 10/2018 | Cedola et al. | |
| 2018/0300602 A1 | 10/2018 | Petre et al. | |
| 2018/0300604 A1 | 10/2018 | Mcbride et al. | |
| 2018/0300605 A1 | 10/2018 | Ambardekar et al. | |
| 2018/0300606 A1 | 10/2018 | Corkery et al. | |
| 2018/0300607 A1 | 10/2018 | Petre et al. | |
| 2018/0300613 A1 | 10/2018 | Petre et al. | |
| 2018/0300614 A1 | 10/2018 | Ambardekar et al. | |
| 2018/0300615 A1 | 10/2018 | Ambardekar et al. | |

(56) References Cited

U.S. PATENT DOCUMENTS

| | | |
|---|---|---|
| 2018/0300616 A1 | 10/2018 | Ambardekar et al. |
| 2018/0300617 A1 | 10/2018 | Mcbride et al. |
| 2018/0300633 A1 | 10/2018 | Mcbride et al. |
| 2018/0300634 A1 | 10/2018 | Mcbride et al. |
| 2020/0233820 A1 | 7/2020 | Mcbride et al. |

FOREIGN PATENT DOCUMENTS

| | | |
|---|---|---|
| EP | 3035204 A1 | 6/2016 |
| EP | 3035249 A1 | 6/2016 |
| WO | 9314459 A1 | 7/1993 |
| WO | 2016118257 A1 | 7/2016 |
| WO | 2016210030 A1 | 12/2016 |

OTHER PUBLICATIONS

"International Search Report and Written Opinion Issued in PCT Application No. PCT/US2018/026358", dated Jul. 11, 2018, 15 Pages.

"International Search Report and Written Opinion Issued in PCT Application No. PCT/US2018/026352", dated Jun. 27, 2018, 11 Pages.

"International Search Report and Written Opinion Issued in PCT Application No. PCT/US2018/026353", dated Jul. 6, 2018, 15 Pages.

"International Search Report and Written Opinion Issued in PCT Application No. PCT/US2018/026354", dated Jul. 31, 2018, 15 Pages.

"International Search Report and Written Opinion Issued in PCT Application No. PCT/US2018/026355", dated Jul. 9, 2018, 16 Pages.

"International Search Report and Written Opinion Issued in PCT Application No. PCT/US2018/026356", dated Jul. 6, 2018, 16 Pages.

"International Search Report and Written Opinion Issued in PCT Application No. PCT/US2018/026357", dated Jul. 9, 2018, 16 Pages.

"Non Final Office Action Issued in U.S. Appl. No. 15/702,311", dated May 21, 2019, 12 Pages.

"Final Office Action Issued in U.S. Appl. No. 15/702,311", dated Nov. 5, 2018, 12 Pages.

"International Search Report & Written Opinion Issued in PCT Patent Application No. PCT/US18/027674", dated Jul. 13, 2018, 13 Pages.

"International Search Report & Written Opinion Issued in PCT Patent Application No. PCT/US18/027680", dated Sep. 27, 2018, 13 Pages.

"International Search Report & Written Opinion Issued in PCT Patent Application No. PCT/US18/027828", dated Aug. 3, 2018, 11 Pages.

"International Search Report & Written Opinion Issued in PCT Patent Application No. PCT/US18/027834", dated Jul. 24, 2018, 11 Pages.

"International Search Report & Written Opinion Issued in PCT Patent Application No. PCT/US18/027836", dated Aug. 3, 2018, 14 Pages.

"International Search Report & Written Opinion Issued in PCT Patent Application No. PCT/US18/027837", dated Aug. 3, 2018, 10 Pages.

"International Search Report & Written Opinion Issued in PCT Patent Application No. PCT/US18/027840", dated Jul. 30, 2018, 9 Pages.

Chi, et al., "PRIME: A Novel Processing-in-memory Architecture for Neural Network Computation in ReRAM-based Main Memory", In Proceedings of ACM/IEEE 43rd Annual International Symposium on Computer Architecture, Jun. 18, 2016, 13 Pages.

"Ex Parte Quayle Action Issued in U.S. Appl. No. 15/950,644", dated Sep. 23, 2019, 7 Pages.

"Notice of Allowance Issued in U.S. Appl. No. 15/694,663", dated May 8, 2020, 9 Pages.

"Notice of Allowance Issued in U.S. Appl. No. 15/702,311", dated Sep. 11, 2019, 6 Pages.

* cited by examiner

FLEXIBLE HARDWARE FOR HIGH THROUGHPUT VECTOR DEQUANTIZATION WITH DYNAMIC VECTOR LENGTH AND CODEBOOK SIZE

RELATED APPLICATION

This application claims priority under 35 U.S.C. Section 119(e) to U.S. Provisional Patent Application No. 62/486,432, filed on Apr. 17, 2017 and titled "Enhanced Neural Network Designs," the entire disclosure of which is incorporated in its entirety by reference herein.

BACKGROUND

In artificial neural networks (NN), a neuron is the base unit used to model a biological neuron in the brain. The model of an artificial neuron includes the inner product of an input vector with a weight vector added to a bias with a non-linearity applied. For deep neural networks (DNN) (e.g., as expressed by an exemplary DNN module), a neuron can be closely mapped to an artificial neuron.

In processing data across a NN or a DNN, the exemplary neurons performing the exemplary processing operation is required to process large amounts of data in order to apply various data processing/manipulation operations that can impact overall NN or DNN performance resulting in crucial latency to the detriment of a desired stated processing goal (e.g., identifying an object and/or object characteristic in exemplary input data—image, sound, geographic coordinates, etc.). Typically, existing NN and DNNs expend avoidable processing time (e.g., floating/fixed point operations per second (GFlops/s)) and memory space (e.g., number of bytes transferred per second (GBytes/s)) in performing these various operations. Specifically, current practices require the reading of neuron weight values from a cooperating memory component before processing by an artificial neuron. Typically, weight values can be stored in general memory such as DRAM or cached in fast local memory such as SRAM. With general memory, time and power is required to read weight values. With local memory, high performance cache memory is costly in and, generally, is size limited. As avoidable time/power is required to read weight values either directly from general memory or indirectly from local cache memory, current practices fall short of fully optimizing the processing capabilities of a NN/DNN.

A traditional approach to overcome the inefficiencies of current practices is to reduce the precision of weight data to reduce the amount of memory required. For example, a 32-bit floating point weight value could be reduced to a 16-bit half precision value which results in a 50% saving in weight memory requirements. The problem with the large reduction of precision of weight values is the reduction of the results accuracy.

A more advantageous NN/DNN would deploy the use of vector quantization of neuron weight values that operatively permits more weight values to be represented in a given amount of local memory which in turns reduces the overhead of loading weight values from main memory into local memory cache and/or reduces the amount of local memory required. Specifically, vector quantization processes can utilize a lookup table to convert weight encodes into weight data. Operatively, by utilizing vector quantization, the entire weight blob can be operatively interpreted as weight encode that can be decoded during run time.

More specifically, vector quantization of weight values operatively can convert contiguous segments of weight values into vectors of an arbitrary length (for example, 2 weight values, 4 weight values, etc.) and each vector can be assigned an index value. During the execution of a neuron compute operation requiring a weight value, an index is used to reference a specific vector of weight values in a look up table that are used for computations. As a single index is used to reference multiple weight values, a reduction of memory space is realized without having to reduce the precision of weight values.

It is with respect to these considerations and others that the disclosure made herein is presented.

SUMMARY

Techniques described herein provide for the use of vector quantization of neuron weight values to reduce memory requirements and processing cycles of an exemplary neural network (NN) and/or Deep Neural Network (DNN) environment. Aspects of the herein described systems and methods relate to the machine/artificial intelligence (MI) hardware architecture. Such architecture and its implementation can be referred to as the "NN". In an illustrative implementation, the use of vector quantization (VQ) in an exemplary NN can result in an increase to the effective neuron performance of reading weight values. In an illustrative operation, one or more indices can be stored to one or more vector rows that can represent weight values with a fast lookup table (physical or virtual). A "weight" can be considered as a numeric value consumed by a neuron processor when processing one or more data elements. Possible formats of a weight value can be arbitrary bit length that can be signed or unsigned, a byte, an integer, and/or a float. A reduction in memory transfer can be realized by using vector quantization, as indices are stored instead of full weight data.

In an illustrative implementation, one or more contiguous segments of weight values can be operatively converted into one or more vectors of arbitrary length and each of the one or more vectors can be assigned an index. The generated indexes can be stored in an exemplary VQ lookup table. In an illustrative operation, during an exemplary execution of a neuron compute operation that may require a weight value, an index can be retrieved from the generated lookup table that can represent a specific vector containing one or more weight values. A neuron compute operation can be considered one or more computational steps performed by one or more neurons to process input data according a selected operation such as convolution or fully connected to generate output data.

One or more rows of the VQ lookup table can be read from a cooperating memory component such as a general or local memory component. The VQ lookup table can consist of N rows and M width and can be operatively used by cooperating Fast Weight Lookup Hardware (FWLH) for fast conversion of an index into a VQ row. FWLH can be considered as hardware logic present in the NN that is operative to speedily perform the conversion of a weight index into a VQ row of the VQ lookup table. In an illustrative implementation, the number of rows N can represent an index range. For example, for 4096 vector rows, an index of 12-bits can be required. The width M which is the number of weight values per row can consist of arbitrary values that can include but are not limited to multiples of 2 such as 2, 4, 8, and 16 and so on. Larger widths of the VQ lookup table can also be operatively deployed if so required.

In the illustrative operation, upon performing a retrieval a vector using an illustrative index value from the VQ lookup table, the corresponding weight values as represented by the vector can be consumed by the neurons as part of an exemplary data processing function of the NN.

In an illustrative implementation, the VQ lookup table can be stored in one or more cooperating hardware components of the NN such as registers, SRAM, and DRAM. Such hardware components can be implemented with a fixed block of memory or a virtual block of memory containing multiple VQ tables with a single base index value to select a currently VQ lookup table.

In another illustrative implementation, one or more virtual VQ lookup tables can be defined within a single physical VQ table having a base index value. In an illustrative implementation, a selectable vector length related to the herein described vector quantization process can be utilized per neuron layer function such that one neuron layer function could use a vector having a first VQ length (e.g., 2), where another neuron layer function could use a vector having a second VQ length (e.g., 4), where yet another neuron layer function could use a vector having a third VQ length (e.g., 16). Illustratively, a neuron layer function can be considered the one or more operations performed by one or more layers of the exemplary neural network environment.

In an illustrative implementation, the herein described systems and methods can be deployed as a "system-on-a-chip" where one or more NN's are instantiated such that the NNs can contain VQ lookup table for weight values.

In an illustrative operation, at an exemplary run time, inline vector dequantization processing can be performed to determine the underlying neuron weight values that can result in the maintenance of neuron throughput and maintain optimized performance of the NN. In an illustrative operation, vector quantization as described herein can be enabled/disabled per neural network layer.

Operatively, the use of vector quantization can result in a number optimized performance operations of the NN including but not limited to: the reduction of memory storage requirements to store the neuron weight values related to neuron network computations; the reduction of required memory bandwidth when executing a neuron layer function; the reduction of required time when executing a neuron layer function; and the reduction of the amount of local cache memory required to achieve a desired performance level of traditional neuron weight value memory management techniques with a higher accuracy in the neuron weight value data.

It should be appreciated that, although described in relation to a system, the above-described subject matter may also be implemented as a computer-controlled apparatus, a computer process, a computing system, or as an article of manufacture such as a computer-readable medium and/or dedicated chipset. These and various other features will be apparent from a reading of the following Detailed Description and a review of the associated drawings. This Summary is provided to introduce a selection of concepts in a simplified form that are further described below in the Detailed Description.

This Summary is not intended to identify key features or essential features of the claimed subject matter, nor is it intended that this Summary be used to limit the scope of the claimed subject matter. Furthermore, the claimed subject matter is not limited to implementations that solve any or all disadvantages noted in any part of this disclosure.

DRAWINGS

The Detailed Description is described with reference to the accompanying figures. In the figures, the left-most digit(s) of a reference number identifies the figure in which the reference number first appears. The same reference numbers in different figures indicate similar or identical items. References made to individual items of a plurality of items can use a reference number with a letter of a sequence of letters to refer to each individual item. Generic references to the items may use the specific reference number without the sequence of letters.

DETAILED DESCRIPTION

Figure 1:
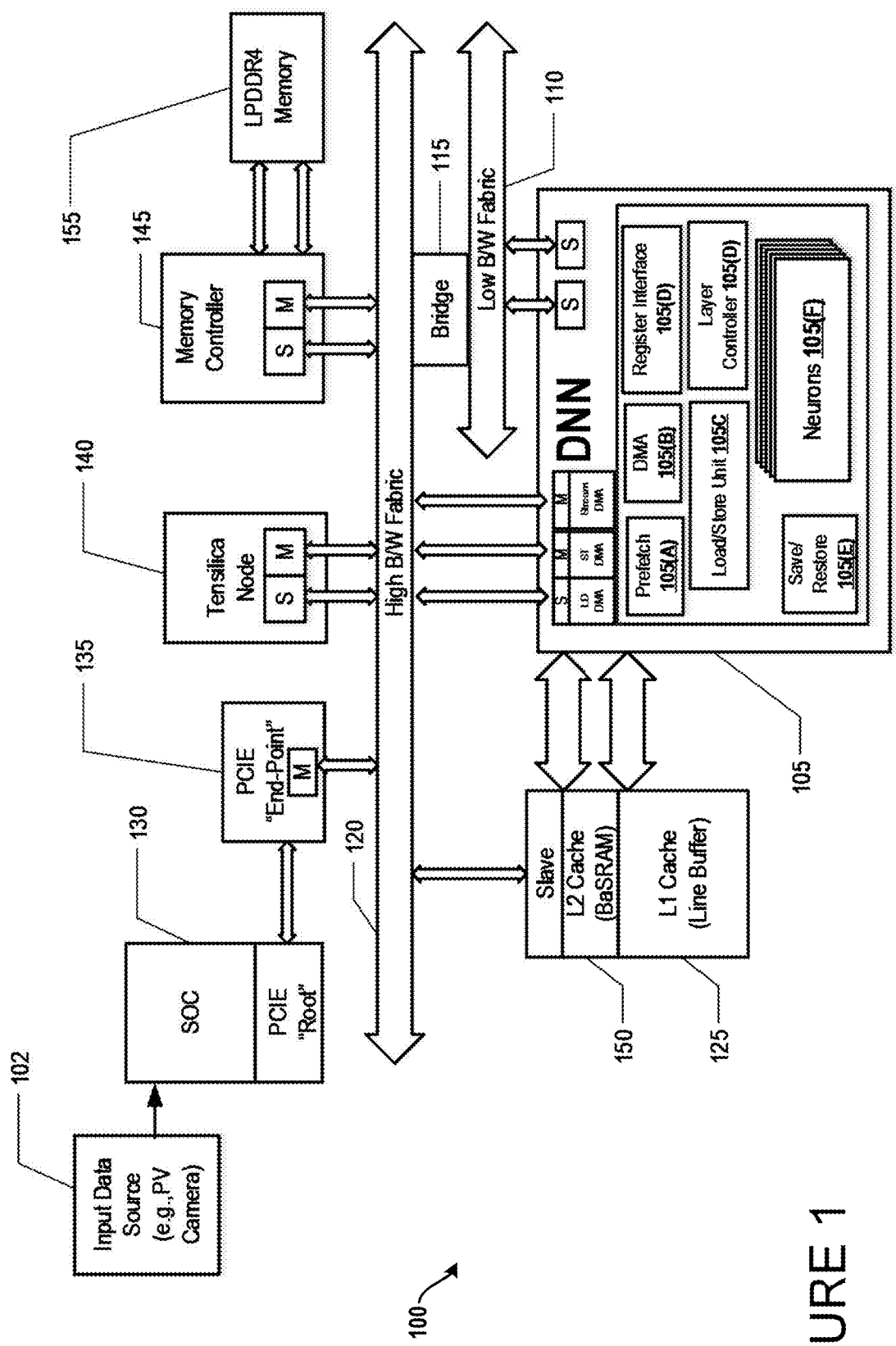
FIG. 1 illustrates a block diagram of an exemplary neural networking computing environment in accordance with the herein described systems and methods.

The following Detailed Description describes techniques for the use of vector quantization of neuron weight values to reduce memory requirements and processing cycles of an exemplary neural network (NN) and/or Deep Neural Network (DNN) environment. Aspects of the herein described systems and methods relate to the machine/artificial intelligence (MI) hardware architecture. Such architecture and its implementation can be referred to as the "NN". In an illustrative implementation, the use of vector quantization (VQ) in an exemplary NN can result in an increase to the effective neuron performance of reading weight values. In an illustrative operation, one or more indices can be stored to one or more vector rows that can represent weight values with a fast lookup table (physical or virtual). A "weight" can be considered as a numeric value consumed by a neuron processor when processing one or more data elements. Possible formats of a weight value can be arbitrary bit length that can be signed or unsigned, a byte, an integer, and/or a float. By using vector quantization indices are stored compared with full weight data, a reduction in memory transfer can be realized.

In an illustrative implementation, one or more contiguous segments of weight values can be operatively converted into one or more vectors of arbitrary length and each of the one or more vectors can be assigned an index. The generated indexes can be stored in an exemplary VQ lookup table. In an illustrative operation, during an exemplary execution of a neuron compute operation that may require a weight value, an index can be retrieved from the generated lookup table that can represent a specific vector containing one or more weight values. A neuron compute operation can be considered one or more computational steps performed by one or more neurons to process input data according a selected operation such as convolution or fully connected to generate output data.

One or more rows of the VQ lookup table can be read from a cooperating memory component such as a general or local memory component. The VQ lookup table can consist of N rows and M width and can be operatively used by cooperating Fast Weight Lookup Hardware (FWLH) for fast conversion of an index into a VQ row. FWLH can be considered as hardware logic present in the NN that is operative to speedily perform the conversion of a weight index into a VQ row of the VQ lookup table. In an illustrative implementation, the number of rows N can represent an index range. For example, for 4096 vector rows, an index of 12-bits can be required. The width M which is the number of weight values per row can consist of arbitrary values that can include but are not limited to multiples of 2 such as 2, 4, 8, and 16 and so on. Larger widths of the VQ lookup table can also be operatively deployed if so required.

In the illustrative operation, upon performing a retrieval a vector using an illustrative index value from the VQ lookup table, the corresponding weight values as represented by the vector can be consumed by the neurons as part of an exemplary data processing function of the NN.

In an illustrative implementation, the VQ lookup table can be stored in one or more cooperating hardware components of the NN such as registers, SRAM, and DRAM. Such hardware components can be implemented with a fixed block of memory or a virtual block of memory containing multiple VQ tables with a single base index value to select a currently VQ lookup table.

In another illustrative implementation, one or more virtual VQ lookup tables can be defined within a single physical VQ table having a base index value. In an illustrative implementation, a selectable vector length related to the herein described vector quantization process can be utilized per neuron layer such that one neuron layer function could use a vector having a first VQ length (e.g., 2), where another neuron layer function could use a vector having a second VQ length (e.g., 4), where yet another neuron layer function could use a vector having a third VQ length (e.g., 16). In an illustrative implementation, the herein described systems and methods can be deployed as a "system-on-a-chip" where one or more NN's are instantiated such that the NNs can contain VQ lookup table for weight values. Illustratively, a neuron layer function can be considered the one or more operations performed by one or more layers of the exemplary neural network environment.

In an illustrative operation, at an exemplary run time, inline vector dequantization processing can be performed to determine the underlying neuron weight values that can result in the maintenance of neuron throughput and maintain optimized performance of the NN. In an illustrative operation, vector quantization as described herein can be enabled/disabled per neural network layer.

Operatively, the use of vector quantization can result in a number optimized performance operations of the NN including but not limited to: the reduction of memory storage requirements to store the neuron weight values related to neuron network computations; the reduction of required memory bandwidth when executing a neuron layer function; the reduction of required time when executing a neuron layer function; and the reduction of the amount of local cache memory required to achieve a desired performance level of traditional neuron weight value memory management techniques with a higher accuracy in the neuron weight value data.

It should be appreciated that the described subject matter may be implemented as a computer-controlled apparatus, a computer process, a computing system, or as an article of manufacture such as a computer-readable storage medium. Among many other benefits, the techniques herein improve efficiencies with respect to a wide range of computing resources. For instance, the determine of the shift stride can reduce a number of computing cycles needed to perform a number of complex tasks, such as facial recognition, object recognition, image generation, etc.

In addition, improved human interaction can be achieved by the introduction of more accurate and faster completion of such tasks. In addition, the use of the shift stride can reduce network traffic, reduce power consumption and usage of memory. Other technical effects other than those mentioned herein can also be realized from implementations of the technologies disclosed herein.

It should be appreciated that, although described in relation to a system, the above-described subject matter may also be implemented as a computer-controlled apparatus, a computer process, a computing system, or as an article of manufacture such as a computer-readable medium and/or dedicated chipset. These and various other features will be apparent from a reading of the following Detailed Description and a review of the associated drawings. This Summary is provided to introduce a selection of concepts in a simplified form that are further described below in the Detailed Description.

In artificial neural networks, a neuron is the base unit used to model a biological neuron in the brain. The model of an artificial neuron can include the inner product of an input vector with a weight vector added to a bias, with a non-linearity applied. Comparatively, a neuron, in an exemplary DNN module, (e.g., 105 of FIG. 1) is closely mapped to an artificial neuron.

Illustratively, the DNN module can be considered a super-scalar processor. Operatively, it can dispatch one or more instructions to multiple execution units called neurons. The execution units can be "simultaneous dispatch simultaneous complete" where each execution unit is synchronized with all of the others. A DNN module can be classified as a SIMD (single instruction stream, multiple data stream) architecture.

Turning to exemplary DNN environment 100 of FIG. 1, DNN module 105 has a memory subsystem with a unique L1 and L2 caching structure. These are not traditional caches, but are designed specifically for neural processing. For convenience, these caching structures have adopted names that reflect their intended purpose. By way of example, the L2 cache 150 can illustratively maintain a selected storage capacity (e.g., one megabyte (1 MB)) with a high speed private interface operating at a selected frequency (e.g., sixteen giga-bits per second (16 GBps)). The L1 cache can maintain a selected storage capacity (e.g., eight kilobytes (8 KB) that can be split between kernel and activation data. The L1 cache can be referred to as a Line Buffer, and the L2 cache is referred to as BaSRAM.

The DNN module can be a recall-only neural network and programmatically support a wide variety of network structures. Training for the network can be performed offline in a server farm or data center. The result of training is a set of parameters that can be known as either weights or kernels. These parameters represent a transform function that can be applied to an input with the result being a classification or semantically labeled output.

In an illustrative operation, the DNN module can accept planar data as input. Input is not limited to image data only, as long as the data presented is in a uniform planar format the DNN can operate on it.

The DNN module operates on a list of layer descriptors which correspond to the layers of a neural network. Illustratively, the list of layer descriptors can be treated by the DNN module as instructions. These descriptors can be pre-fetched from memory into the DNN module and executed in order.

Generally, there can be two main classes of layer descriptors: 1) Memory-to-memory move descriptors, and 2) Operation descriptors. Memory-to-memory move descriptors can be used to move data to/from the main memory to/from a local cache for consumption by the operation descriptors. Memory-to-memory move descriptors follow a different execution pipeline than the operation descriptors. The target pipeline for memory-to-memory move descriptors can be the internal DMA engine, whereas the target pipeline for the operation descriptors can be the neuron processing elements. Operation descriptors are capable of many different layer operations.

The output of the DNN is also a blob of data. The output can optionally be streamed to a local cache or streamed to main memory. The DNN module can pre-fetch data as far ahead as the software will allow. Software can control pre-fetching by using fencing and setting dependencies between descriptors. Descriptors that have dependencies sets are prevented from making forward progress until the dependencies have been satisfied.

Turning now to FIG. 1, an exemplary neural network environment 100 can comprise various cooperating components inclusive of DNN module 105, cache memory 125 or 150, low bandwidth fabric 110, bridge component 115, high bandwidth fabric 120, SOC 130, PCIE "End Point" 135, Tensilica Node 140, memory controller 145, LPDDR4 memory 155, and an input data source 102. Further, as is shown, DNN module 105 can also comprise a number of components comprising prefetch 105(A), DMA 105(B), Register Interface 105(D), load/store unit 105(C), layer controller 105(D), save/restore component 105(E), and neurons 105(F). Operatively, an exemplary DNN environment 100 can process data according to a selected specification wherein the DNN module performs one or more functions as described herein.

Figure 2:
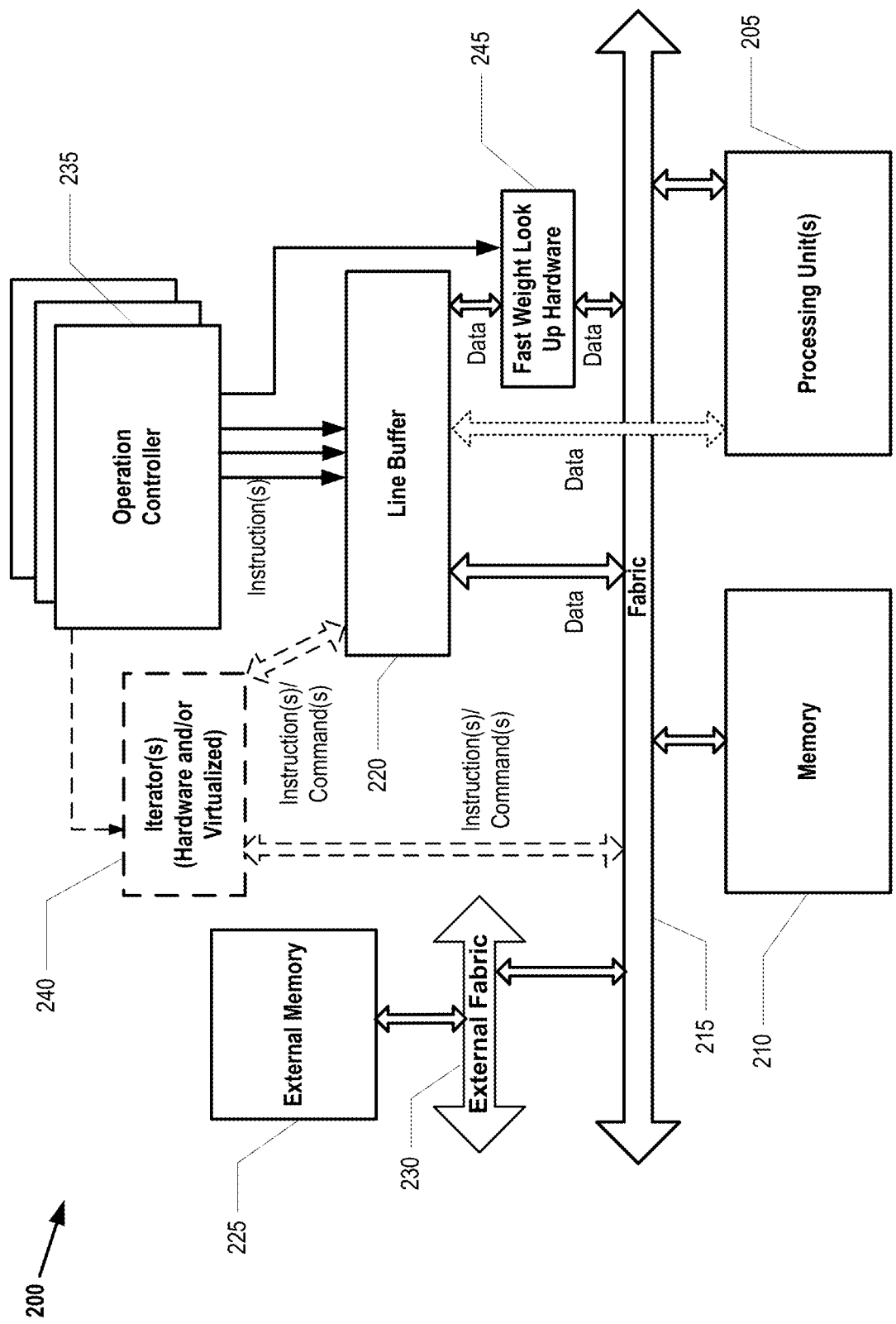
FIG. 2 illustrates a block diagram of an exemplary neural networking environment having cooperating components in accordance with the herein described systems and methods.

FIG. 2 illustrates an exemplary neural network environment 200 operable to employ a directed line buffer 220 as part of data processing. As is shown, the exemplary neural network environment 200 (also referred to herein as a computing device or a computing device environment) comprises one or more operation controllers 235 that cooperate with line buffer 220 to provide one or more instructions for data processing. Line buffer 220 can operate to receive data from cooperating external memory component 225 through external fabric 230 and fabric 215 as well as operating to receive one or more instructions/commands from iterator(s) 240 (e.g., hardware based and/or virtualized iterators) (e.g., an instruction/command to read data from a cooperating memory component and/or an instruction to write data loaded from the cooperating memory component in the line buffer). Furthermore, as is shown in FIG. 2, exemplary neural network environment can also include fast weight look up hardware 245 (FWLH) that can operatively receive a request for dequantizing one or more neuron weights that are received as a list of indicies of an exemplary codebook. In an illustrative operation, FWLH 245 can receive the neuron weight data from one or more cooperating memory components (210, 225) through fabric 215. FWLH 245 can process the neuron weight indicies data, dequantize the received data to produce the same number of vectors (i.e., codebook entries) that can be operatively written to line buffer 220.

Operatively, line buffer 220 can shift data according to a selected stride width according to one or more instructions received from one or more operation controller(s) 235 (also referred to herein as a "cooperating controller component 235"). Furthermore, line buffer 220 can cooperate with processing unit(s) (e.g., neuron(s)) to provide the written bit shifted data for further processing directly or indirectly through fabric 215. A neural network environment fabric can be a data bus capable of passing through various data. A directed line buffer can be considered as a memory component capable of reading and writing data and/or data elements according to one or more received instructions.

Figure 6:
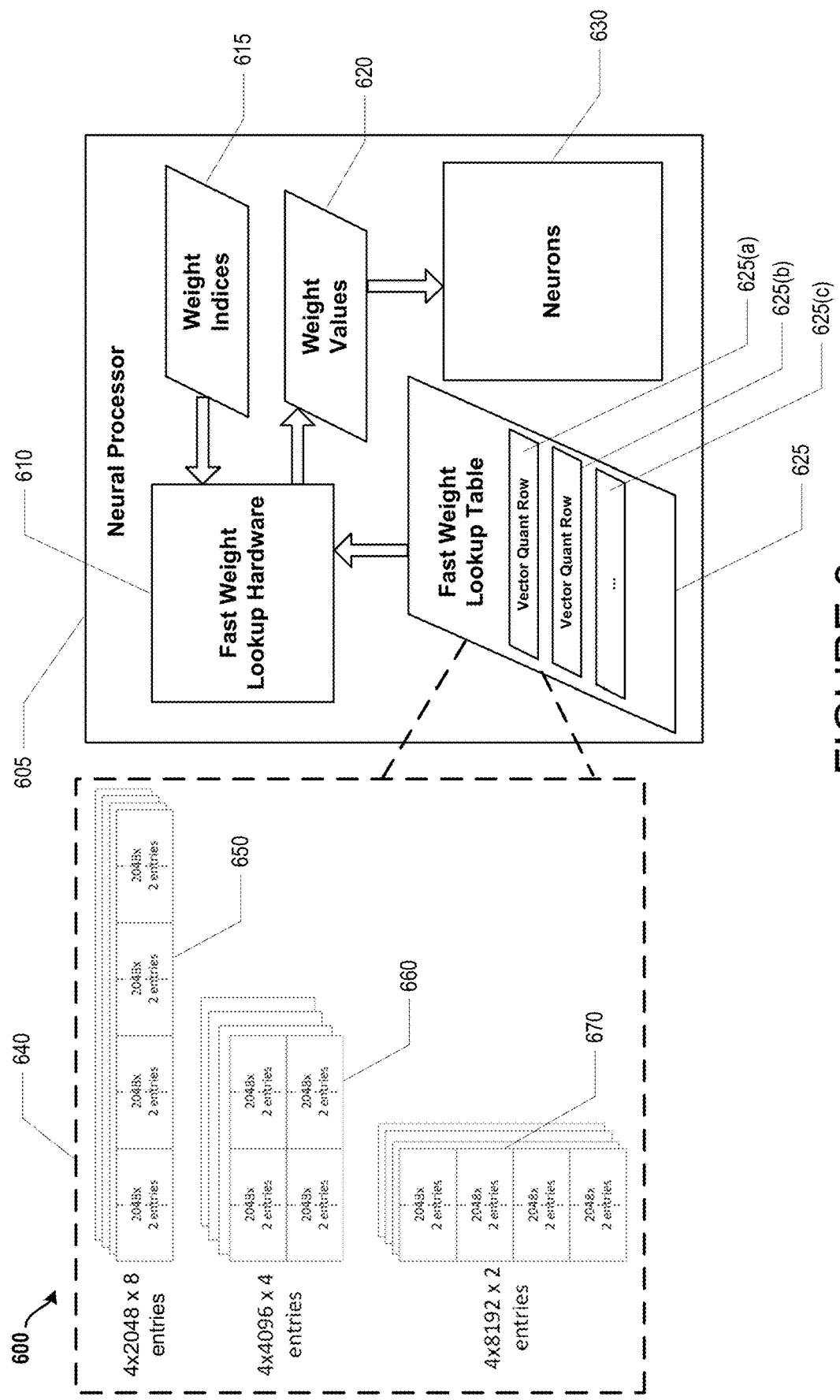
FIG. 6 is a block diagram showing the interaction of various components of an exemplary neural network environment operative to perform vector quantization/dequantization of neuron weight values in accordance with the herein described systems and methods.
Figure 7:
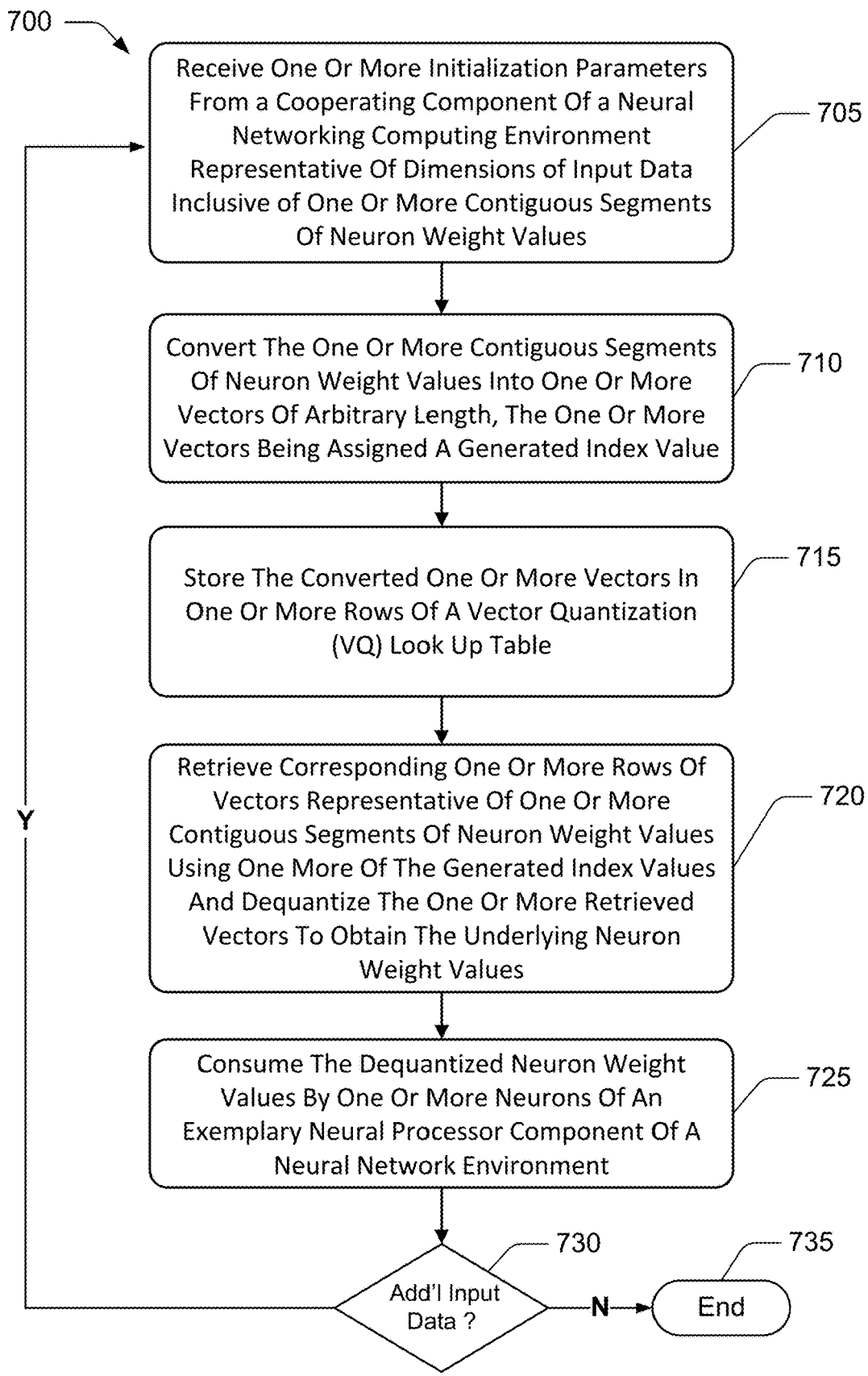
FIG. 7 is a flow diagram of an illustrative process for processing data according to a vector quantization/dequantization of required neuron weight values in an illustrative neural networking computing environment.

In the illustrative operation, the exemplary neural network environment 200 can operatively process data according to the process described in FIG. 7. Specific to the components described in FIG. 2, these components are merely illustrative, as one of ordinary skill in the art would appreciate the processing described in FIGS. 6 and 7 to be also performed by other components than those illustrated in FIG. 2.

Also, as is shown in FIG. 2, the exemplary neural network environment can optionally include one or more iterators (e.g., hardware based and/or virtualized iterators) (as indicated by the dashed lines) that can illustratively operate to iterate input data (not shown) for processing by one more neuron processors 205. It is appreciated by one skilled in the art that such optional inclusion of exemplary one or more iterators is merely illustrative as the inventive concepts described by the herein disclosed systems and methods are operative in an exemplary neural network environment 200 operating without any iterators.

Figure 3:
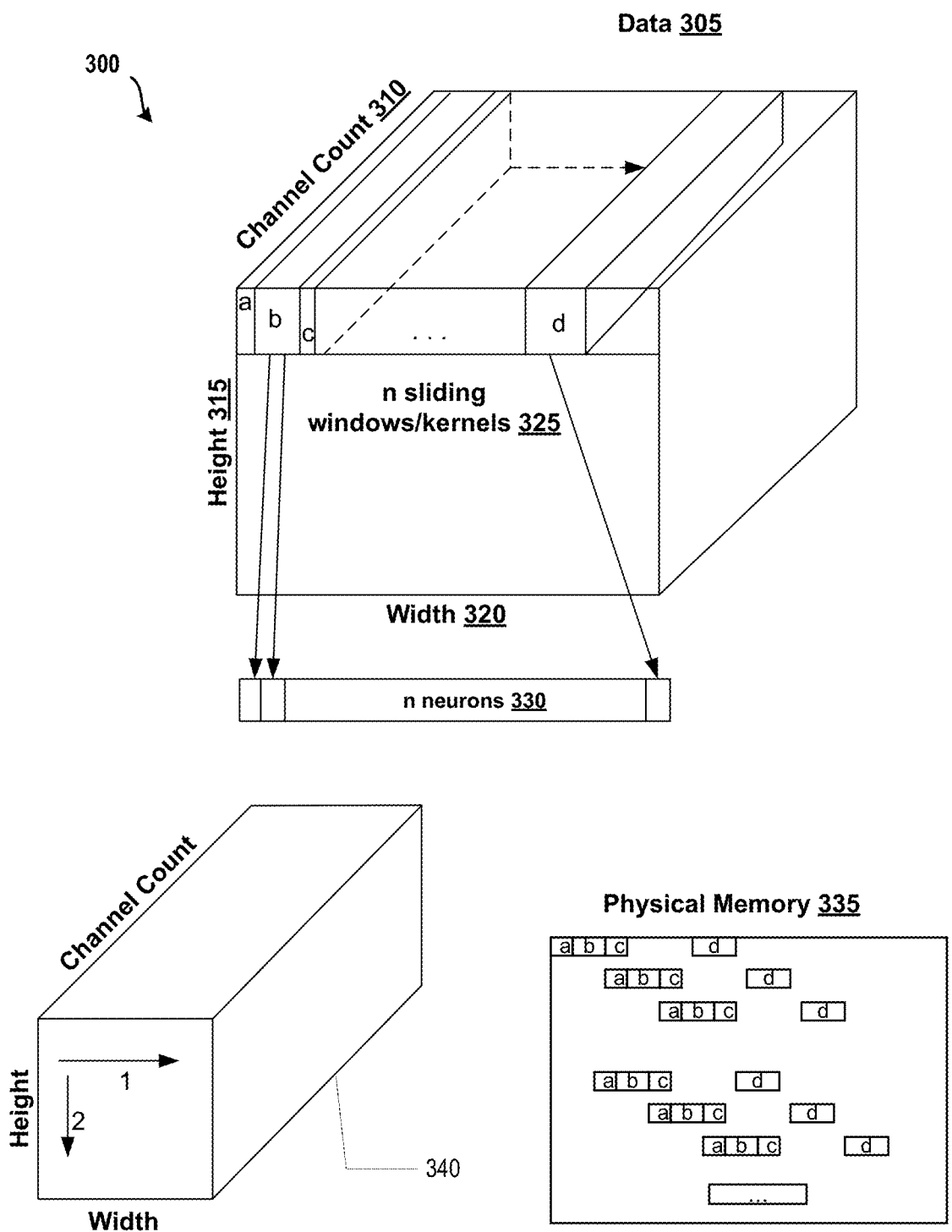
FIG. 3 illustrates a block diagram of exemplary input data represented in an illustrative logical data mapping according to the herein described systems and methods.

FIG. 3 illustrates an example logical data mapping 300 for exemplary input data. As is shown, data 305 can be represented as data having a certain dimension 340 (e.g., such that data dimensions taken as a whole can define a data volume) comprising channel count 310, height 315, and width 320. According to the herein described systems and methods, data 305 can be portioned and prepared for processing by cooperating n neurons 330 such that a first portion a can be communicated to a first neuron, a second portion b can be communicated to a second neuron, and so forth until n portions are communicated to n neurons.

In an illustrative operation, the portions of data 305 can be determined using n sliding window/kernels 325 based on one or more instructions provided by a cooperating controller component of an exemplary neural network environment (e.g., 200 of FIG. 2). Further, as is shown, the input data portions a, b, c, and d can be addressed to a physical memory 325 using one or more initialization parameters provided by a cooperating operation controller component (235) of an exemplary neural network environment (e.g., 200 of FIG. 2).

Figure 4:
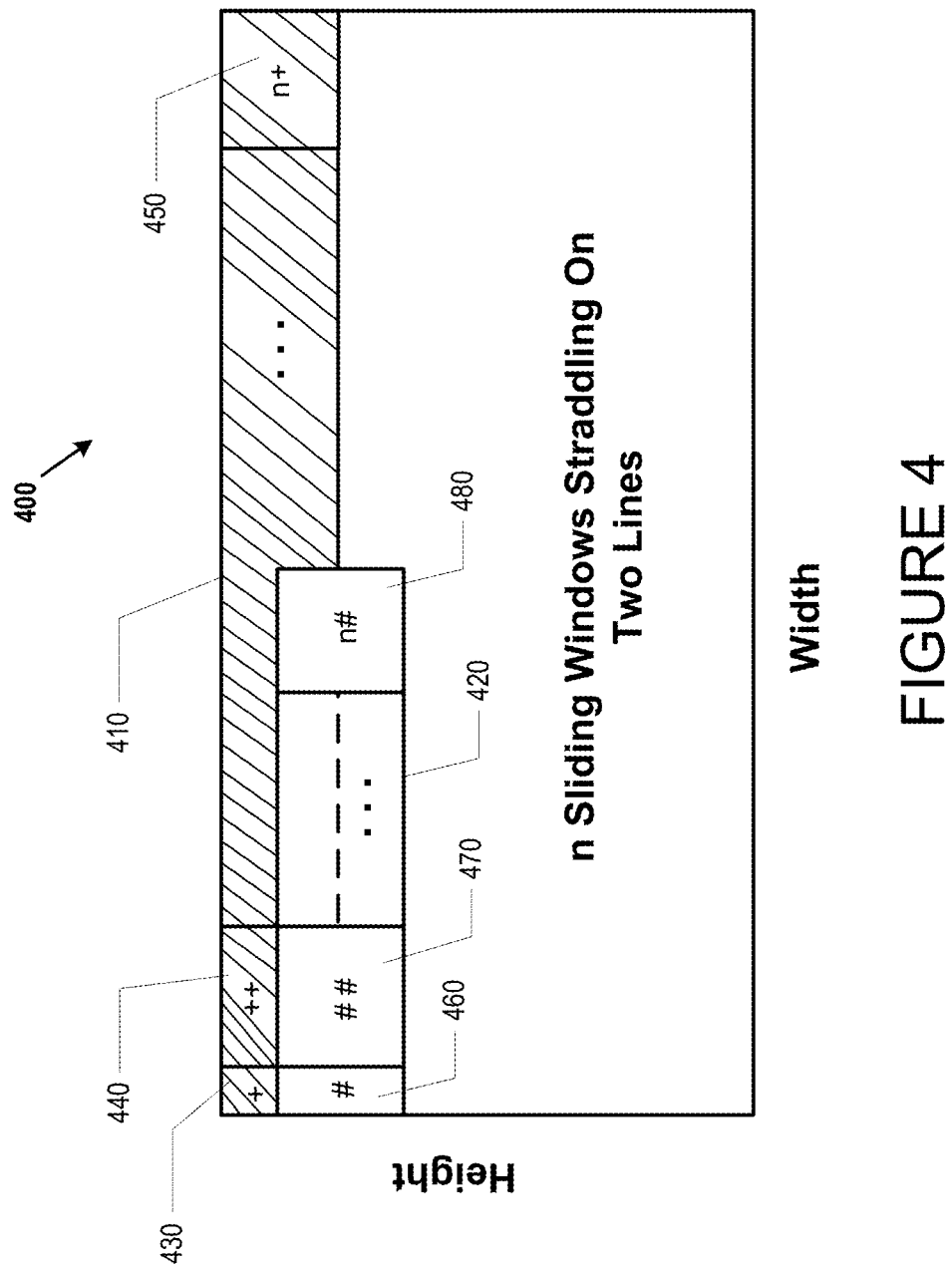
FIG. 4 illustrates a block diagram of exemplary input data represented in an illustrative logical data mapping showing the use of illustrative n sliding windows operative to straddle one or more lines of the illustrative logical data mapping.

FIG. 4, illustrates an exemplary logical data map 400 of exemplary input data (not shown). Exemplary logical data map 400 comprises a first line 410 (illustrated with diagonal marks) and a second line 420 (illustrated by dashes). Each map line can include a number of sliding windows (e.g., 430, 440, and 450 for the first line 410 and 460, 470, and 480 for the second line 420). Additionally, as is shown, the logical data map 400 shows the ability of the sliding windows to straddle a data dimensional boundary of the input data (e.g., straddling the first line 410 and the second line 420). Such ability allows for increased performance as more data can be prepared more efficiently for subsequent processing by the cooperating neural network processing components (e.g., 205 of FIG. 2).

Figure 5:
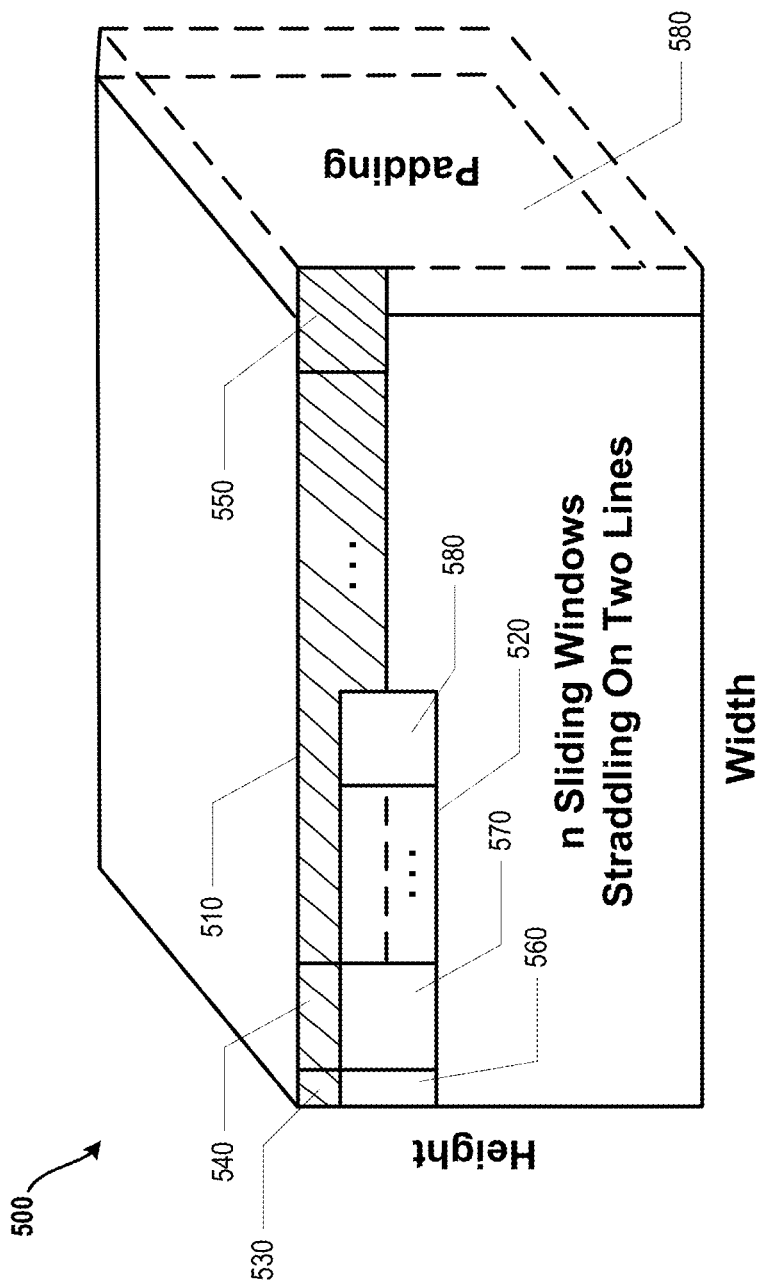
FIG. 5 illustrates a block diagram of exemplary input data represented in an illustrative logical data mapping showing the use of illustrative n sliding windows operative to straddle one or more lines of the illustrative logical data mapping operative to allow for data padding as a processing enhancement in accordance with the herein described systems and methods.

FIG. 5 is similar to FIG. 4 and is presented to describe the ability of the herein described systems and methods to allow for the use of padding to further enhance the performance characteristics of an exemplary neural network environment (e.g., 100 of FIGS. 1 and 200 of FIG. 2). As is shown, logical data map 500 (of exemplary input data not shown) can include various sliding windows (530, 540, 550, 560, 570, and 580) that straddle across one or more lines (e.g., 510 and 520). Additionally, the logical data map 500 can also include padding 580.

In an illustrative operation, at runtime of an exemplary neural network environment (100 of FIG. 1 or 200 of FIG. 2), padding 580 can be added dynamically. The operation controller 235 of FIG. 2 can specify the amount of padding to be used on each of the dimensions 340 shown in FIG. 3 (e.g., such that the dimensions taken collectively can be considered a data volume) of the input data (e.g., blob), and the neural network environment (e.g., iterator controller instructions) can operatively construct data volumes as if the padding was physically present in memory. Default values can also be generated by the exemplary neural network environment (e.g., iterator controller instructions) in the iterator output positions where the padding was added.

FIG. 6 is a diagram showing the interaction of various components of an exemplary neural network environment 600 operative to perform vector quantization/dequantization of neuron weight values. As is shown in FIG. 6, exemplary neural network environment 600 can comprise exemplary neural processor 605 (e.g., 100 of FIG. 1). Neural Processor 605 can further comprise fast weight lookup hardware 610 that operatively processes weight indices 615 as well as data from exemplary fast weight lookup table 625 to retrieve/dequantize neuron weight values 620 for consumption by exemplary neurons 630. Further, as is shown, fast weight lookup table 625 can comprise a number of rows 625(*a*), 625(*b*), and 625(*c*) and so on.

In an illustrative operation, one or more indices can be stored to one or more vector rows such as 625(*a*), 625(*b*), 625(*c*) that can represent weight values with a fast lookup table 625, the fast lookup table can illustratively be a physical hardware table or a virtualized table created in software. In an illustrative implementation, one or more contiguous segments of weight values can be operatively converted into one or more vectors of arbitrary length and each of the one or more vectors can be assigned an index. The generated indexes can be stored in exemplary VQ lookup table 625.

One or more rows of the VQ lookup table 625 can be read from a cooperating memory component such as a general or local memory component. The VQ lookup table can consist of N rows and M width and can be operatively used by cooperating Fast Weight Lookup Hardware (FWLH) 610 for fast conversion of an index into a VQ row. FWLH 610 can be considered as hardware logic present in the NN that is operative to speedily perform the conversion of a weight index into a VQ row 625(*a*), 625(*b*), and 615(*c*) of the VQ lookup 625 table.

In an illustrative implementation, the number of rows N can represent an index range. For example, for 4096 vector rows, an index of 12-bits can be required. The width M which is the number of weight values per row can consist of arbitrary values that can include but are not limited to multiples of 2 such as 2, 4, 8, and 16 and so on. Larger widths of the VQ lookup table can also be operatively deployed if so required.

In the illustrative operation, upon performing a retrieval of a vector using an illustrative index value from the VQ lookup table, the corresponding weight values 620 as represented by the vector can be dequantized by FWLH 610 according to one or more codebooks resident on a physical memory component 640 of FWLH 610 and can be consumed by the neurons 630 as part of an exemplary data processing function of the NN.

As is shown in FIG. 6, by way of illustration, Fast Weight Look Up Table 625 can store configuration data for an exemplary array of physical memory 640 operative by FWLH 610 and having one or more illustrative dynamic physical memory configurations 650, 660, and 670 for use in the dequantization of stored vectors utilizing a selected codebooks. A codebook is represented as a list of the vectors used for quantizing the data. The position (index) of each vector in this list can operatively represent the quantized vector. More than one codebook can be employed to achieve the desired dequantization rate. In an exemplary case, in the second case 660 as shown in in FIG. 6, employing 4 codebooks and dequantizing 4 indices simultaneously effectively 16 (4 entries per row*4 codebooks) weight entries can be dequantized to achieve the desired dequantization rate.

In an illustrative operation, the one or more dynamic physical memory configurations 650, 660, and 670 can be employed by one or more of processing layers of the exemplary neural network environment if such vector quantization/dequantization processing is activated for such one or more processing layers.

In the illustrative operation, the illustrative dynamic physical memory configurations can be configured by setting an exemplary configuration register (not shown) that can be a resident component of FWLH 610 to allow for the use of one of these exemplary physical memory configurations 650, 660, and 670 for one or more of the processing layers of the exemplary neural network environment. Operatively, the dynamic physical memory can be used by the FWLH 610 to load thereon an exemplary codebook used as part of the vector dequantization processing.

In an illustrative implementation, each of the cooperating physical memories can maintain a copy of the codebook. Operatively, when an exemplary codebook is loaded into physical memory, a single copy of the codebook can be copied from a cooperating memory component (e.g., DRAM) to the codebook memory and the FWLH 610 can operatively automatically write the single codebook memory data into the other cooperating physical memories.

It is appreciated that although dynamic physical memory locations are described in FIG. 6 as having an exemplary number of bits and entries, that such examples are merely illustrative as the inventive concepts described herein contemplate the use of other alternative bit and entry counts.

FIG. 7 is a flow diagram of an illustrative process 700 utilizing vector quantization of neuron weight values to enhance the performance for a NN/DNN environment. As is shown, processing begins at block 705 where one or more initialization parameters are received from a cooperating component of the neural network environment (e.g., operation controller) wherein the one or more initialization parameters can include data representative of the dimensions for input data inclusive of one or more contiguous segments of neuron weight values. Processing then proceeds to block 710 where the one or more contiguous segments of neuron weight values are converted into one or more vectors of arbitrary length and assigned a generated index value.

The converted one or more vectors are then stored in one or more rows of a vector quantization lookup table at block 715. Processing then proceeds to block 720 were one or more rows of the vectors are operatively retrieved using the one or more of the generated index values of step 710 and dequantized to obtain the underlying neuron weight values. The retrieved weight values are then illustratively consumed by one or more neurons of an exemplary neural processor component of a neural network environment at block 725.

A check is then performed at block 730 to determine if there is additional input data to be processed (i.e., as part of an iteration operation). If there is no additional input data, processing terminates at block 735. However, if additional input data requires an iteration operation, processing then reverts to block 710 and proceeds from there.

Figure 8:
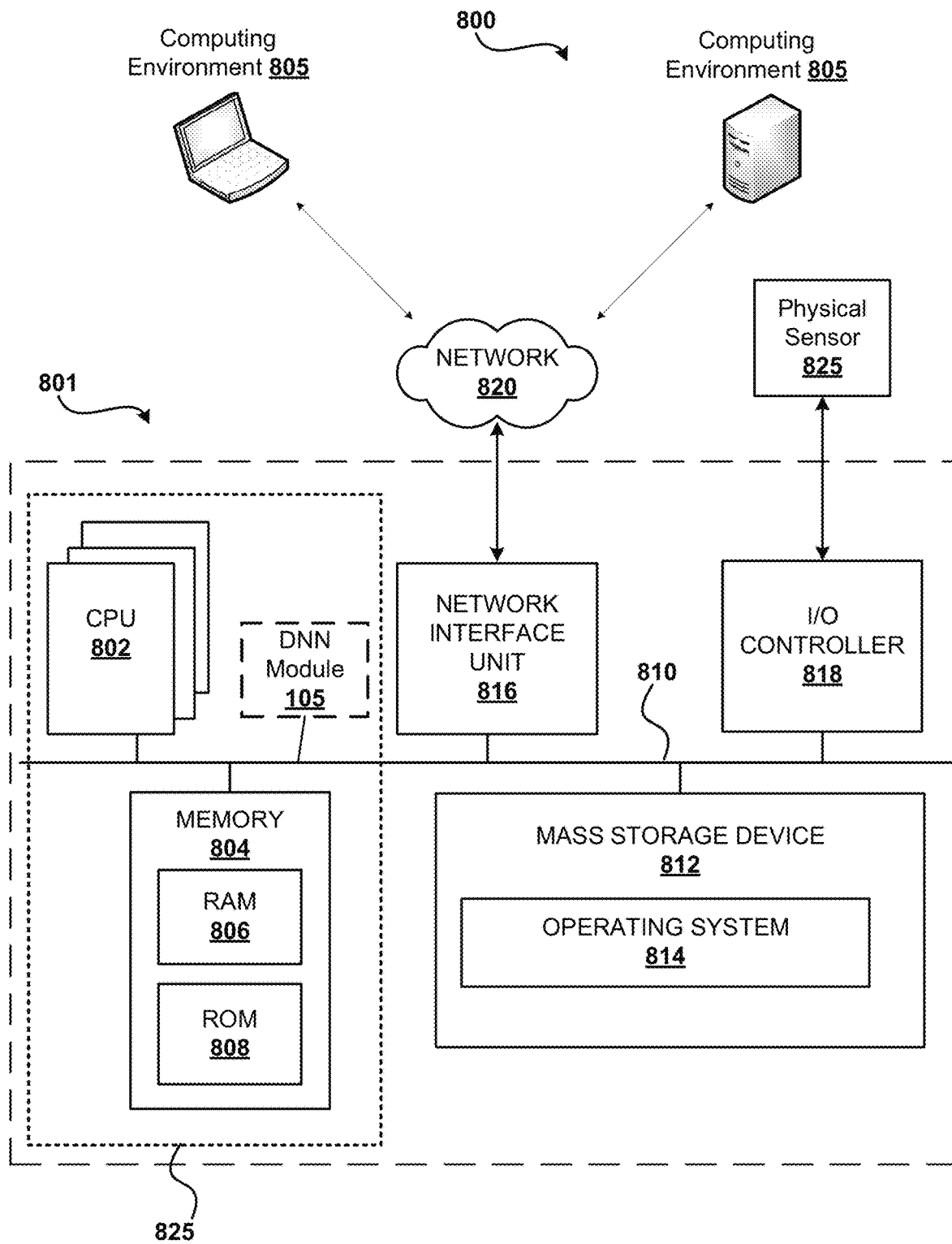
FIG. 8 shows additional details of an illustrative computer architecture for a computer capable of executing the herein described methods.

The computer architecture 800 illustrated in FIG. 8 includes a central processing unit 802 ("CPU"), a system memory 804, including a random-access memory 806 ("RAM") and a read-only memory ("ROM") 808, and a system bus 810 that couples the memory 804 to the CPU 802. A basic input/output system containing the basic routines that help to transfer information between elements within the computer architecture 800, such as during startup, is stored in the ROM 808. The computer architecture 800 further includes a mass storage device 812 for storing an operating system 814, other data, and one or more application programs.

The mass storage device 812 is connected to the CPU 802 through a mass storage controller (not shown) connected to the bus 810. The mass storage device 812 and its associated computer-readable media provide non-volatile storage for the computer architecture 800. Although the description of computer-readable media contained herein refers to a mass storage device, such as a solid-state drive, a hard disk or CD-ROM drive, it should be appreciated by those skilled in the art that computer-readable media can be any available computer storage media or communication media that can be accessed by the computer architecture 800.

Communication media includes computer readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

By way of example, and not limitation, computer storage media may include volatile and non-volatile, removable and non-removable media implemented in any method or technology for storage of information such as computer-readable instructions, data structures, program modules or other data. For example, computer media includes, but is not limited to, RAM, ROM, EPROM, EEPROM, flash memory or other solid-state memory technology, CD-ROM, digital versatile disks ("DVD"), HD-DVD, BLU-RAY, or other optical storage, magnetic cassettes, magnetic tape, magnetic disk storage or other magnetic storage devices, or any other medium which can be used to store the desired information and which can be accessed by the computer architecture 800. For purposes of the claims, the phrase "computer storage medium," "computer-readable storage medium" and variations thereof, does not include waves, signals, and/or other transitory and/or intangible communication media, per se.

According to various techniques, the computer architecture 800 may operate in a networked environment using logical connections to remote computers through a network 820 and/or another network (not shown). The computer architecture 800 may connect to the network 820 through a network interface unit 816 connected to the bus 810. It should be appreciated that the network interface unit 816 also may be utilized to connect to other types of networks and remote computer systems. The computer architecture 800 also may include an input/output controller 818 for receiving and processing input from a number of other devices, including a keyboard, mouse, or electronic stylus (not shown in FIG. 8). Similarly, the input/output controller 818 may provide output to a display screen, a printer, or other type of output device (also not shown in FIG. 8). It should also be appreciated that via a connection to the network 820 through a network interface unit 816, the computing architecture may enable DNN module 105 to communicate with the computing environments 100.

It should be appreciated that the software components described herein may, when loaded into the CPU 802 and/or the DNN Module 105 and executed, transform the CPU 802 and/or the DNN Module 105 and the overall computer architecture 800 from a general-purpose computing system into a special-purpose computing system customized to facilitate the functionality presented herein. The CPU 802 and/or the DNN Module 105 may be constructed from any number of transistors or other discrete circuit elements and/or chipset, which may individually or collectively assume any number of states. More specifically, the CPU 802 and/or the DNN Module 105 may operate as a finite-state machine, in response to executable instructions contained within the software modules disclosed herein. These computer-executable instructions may transform the CPU 802 by specifying how the CPU 802 transitions between states, thereby transforming the transistors or other discrete hardware elements constituting the CPU 802.

Encoding the software modules presented herein also may transform the physical structure of the computer-readable media presented herein. The specific transformation of physical structure may depend on various factors, in different implementations of this description. Examples of such factors may include, but are not limited to, the technology used to implement the computer-readable media, whether the computer-readable media is characterized as primary or secondary storage, and the like. For example, if the computer-readable media is implemented as semiconductor-based memory, the software disclosed herein may be encoded on the computer-readable media by transforming the physical state of the semiconductor memory. For example, the software may transform the state of transistors, capacitors, or other discrete circuit elements constituting the semiconductor memory. The software also may transform the physical state of such components in order to store data thereupon.

As another example, the computer-readable media disclosed herein may be implemented using magnetic or optical technology. In such implementations, the software presented herein may transform the physical state of magnetic or optical media, when the software is encoded therein. These transformations may include altering the magnetic characteristics of particular locations within given magnetic media. These transformations also may include altering the physical features or characteristics of particular locations within given optical media, to change the optical characteristics of those locations. Other transformations of physical media are possible without departing from the scope and spirit of the present description, with the foregoing examples provided only to facilitate this discussion.

In light of the above, it should be appreciated that many types of physical transformations take place in the computer architecture 800 in order to store and execute the software components presented herein. It also should be appreciated that the computer architecture 800 may include other types of computing devices, including hand-held computers, embedded computer systems, personal digital assistants, and other types of computing devices known to those skilled in the art. It is also contemplated that the computer architecture 800 may not include all of the components shown in FIG. 8, may include other components that are not explicitly shown in FIG. 8, or may utilize an architecture completely different than that shown in FIG. 8.

Computing system 800, described above, can be deployed as part of a computer network. In general, the above description for computing environments applies to both server computers and client computers deployed in a network environment.

Figure 9:
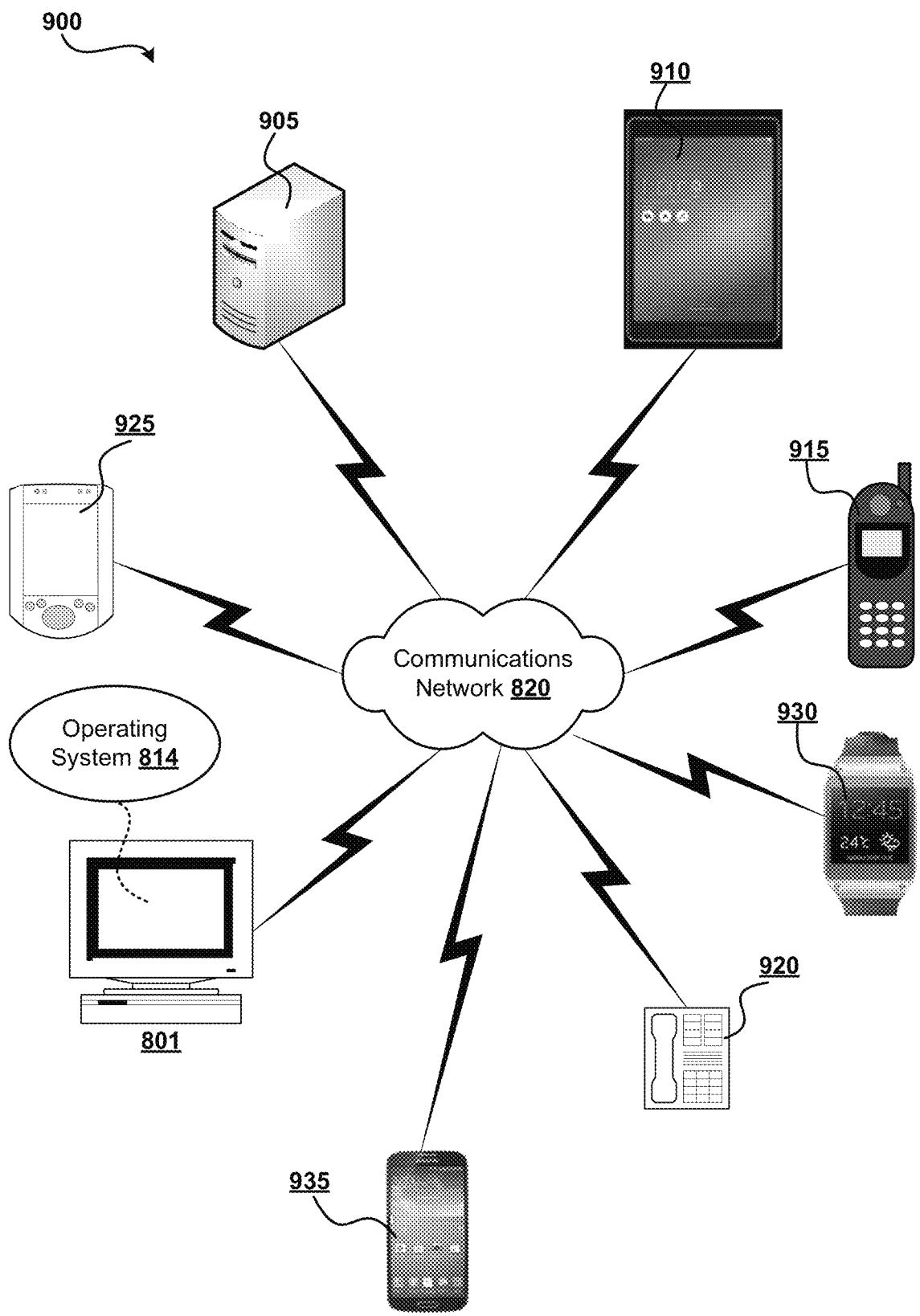
FIG. 9 shows additional details of illustrative computing devices cooperating in accordance with the herein described systems and methods.

FIG. 9 illustrates an exemplary illustrative networked computing environment 900, with a server in communication with client computers via a communications network, in which the herein described apparatus and methods may be employed. As shown in FIG. 9, server(s) 905 may be interconnected via a communications network 820 (which may be either of, or a combination of, a fixed-wire or wireless LAN, WAN, intranet, extranet, peer-to-peer network, virtual private network, the Internet, Bluetooth communications network, proprietary low voltage communications network, or other communications network) with a number of client computing environments such as a tablet personal computer 910, a mobile telephone 915, a telephone 920, a personal computer(s) 801, a personal digital assistant 925, a smart phone watch/personal goal tracker (e.g., Apple Watch, Samsung, FitBit, etc.) 930, and a smart phone 935. In a network environment in which the communications network 820 is the Internet, for example, server(s) 905 can be dedicated computing environment servers operable to process and communicate data to and from client computing environments 801, 910, 915, 920, 925, 930, and 935 via any of a number of known protocols, such as, hypertext transfer protocol (HTTP), file transfer protocol (FTP), simple object access protocol (SOAP), or wireless application protocol (WAP). Additionally, the networked computing environment 900 can utilize various data security protocols such as secured socket layer (SSL) or pretty good privacy (PGP). Each of the client computing environments 801, 810, 815, 820, 825, 830, and 835 can be equipped with computing environment 805 operable to support one or more computing applications or terminal sessions such as a web browser (not shown), or other graphical user interface (not shown), or a mobile desktop environment (not shown) to gain access to the server computing environment(s) 905.

Server(s) 905 may be communicatively coupled to other computing environments (not shown) and receive data regarding the participating user's interactions/resource network. In an illustrative operation, a user (not shown) may interact with a computing application running on a client computing environment(s) to obtain desired data and/or computing applications. The data and/or computing applications may be stored on server computing environment(s) 905 and communicated to cooperating users through client computing environments 901, 910, 915, 920, 925, 930, and 935, over an exemplary communications network 820. A participating user (not shown) may request access to specific data and applications housed in whole or in part on server computing environment(s) 905. These data may be communicated between client computing environments 801, 910, 915, 920, 925, 930, 935 and server computing environment(s) 905 for processing and storage. Server computing environment(s) 905 may host computing applications, processes and applets for the generation, authentication, encryption, and communication of data and applications and may cooperate with other server computing environments (not shown), third party service providers (not shown), network attached storage (NAS) and storage area networks (SAN) to realize application/data transactions.

EXAMPLE CLAUSES

The disclosure presented herein may be considered in view of the following clauses.

Example Clause A, a system for enhanced data processing in a neural network environment (100), the system comprising at least one processor, at least one memory component, and at least one memory in communication with the at least one processor, the at least one memory having computer-readable instructions stored thereupon that, when executed by the at least one processor, cause the at least one processor to: receive one or more initialization parameters from a cooperating controller component of the neural network environment, the initialization parameters comprising data representative of the dimensions of the data to be processed by the neural network environment and data representative of one or more vector quantization index values, the one or more index values representative of one or more vectors stored on the at least one memory component, the one or more vectors comprising data representative of one or more contiguous segments of one or more neuron weight values, retrieve from the at least one memory component the one or more vectors representative of one or more neuron weight values utilizing the one or more vector quantization index values (615), dequantize the retrieved one or more vectors to retrieve underlying one or more neuron weight values, and communicate the one or more neuron weight values (620) for processing by the one or more processing components (630) of the neural network environment.

Example Clause B, the system of Example Clause A, wherein the one or more vectors are stored in a fast lookup table residing on the at least one memory component.

Example Clause C, the system of Example Clause A and B, wherein the one or more vectors have an arbitrary length.

Example Clause D, the system of Example Clauses A through C, wherein the computer-readable instructions further cause the at least one processor to retrieve the one or more vectors from one or more rows of the fast lookup table.

Example Clause E, the system of Example Clauses A through D, wherein the vector length of the one or more vectors is selectable for each of the neuron layers of the neural network environment.

Example Clause F, the system of Example Clauses A through E, wherein the computer-readable instructions further cause the at least one processor to perform vector dequantization of one or more neuron weight values for selected one or more of the neuron layers of the neural network environment.

Example Clause G, the system of Example Clauses A through F, wherein the computer-readable instructions further comprising one or more hardware components operative to perform a fast lookup of the vectors stored on the fast look up table.

Example Clause H, a computer-implemented method, comprising: receiving one or more initialization parameters from a cooperating controller component of the neural network environment, the initialization parameters comprising data representative of the dimensions of the data to be processed by the neural network environment and data representative of one or more vector quantization index values, the one or more index values representative of one or more vectors stored on the at least one memory component, the one or more vectors comprising data representative of one or more contiguous segments of one or more neuron weight values, the one or more vectors generated by a processor of the neural network environment, retrieving from the at least one memory component the one or more vectors representative of one or more neuron weight values utilizing the one or more vector quantization index values, the one or more vectors operatively stored on a fast lookup table, dequantizing the retrieved one or more vectors to retrieve underlying one or more neuron weight values, and communicating the one or more neuron weight values for processing by the one or more processing components of the neural network environment.

Example Clause H, the computer-implemented method of Example Clause G, further comprising inline dequantization of the one or more retrieved vectors to obtain the one or more neuron weight values by one or more cooperating hardware components of the neural network environment.

Example Clause I, the computer-implemented method of Example Clauses G and H, further comprising utilizing a base index in a cooperating memory component for the one or more generated vectors to generate virtualized one or more fast lookup tables.

Example Clause J, the computer-implemented method of Example Clauses G through I, further comprising generating one or more vectors for one or more neuron layers of the neural network environment.

Example Clause K, the computer-implemented method of Example Clauses G through J, further comprising storing the one or more vectors in one or more rows of a fast lookup table.

Example Clause L, the computer-implemented method of Example Clauses G through K, further comprising generating one or more vectors of arbitrary length.

Example Clause M, the computer-implemented method of Example Clauses G through L, further comprising selecting a vector length for the generation of the one or more vectors for each of the neuron layers of the neural network environment.

Example Clause N, the computer-implemented method of Example Clauses G through M, further comprising storing the one or more generated vectors in a local memory component.

Example Clause O, a computer-readable storage medium having computer-executable instructions stored thereupon which, when executed by one or more processors of a computing device, cause the one or more processors of the computing device to: receive one or more initialization parameters from a cooperating controller component of the neural network environment, the initialization parameters comprising data representative of the dimensions of the data to be processed by the neural network environment and data representative of one or more vector quantization index values, the one or more index values representative of one or more vectors stored on the at least one memory component, the one or more vectors comprising data representative of one or more contiguous segments of one or more neuron weight values, retrieve from the at least one memory component the one or more vectors representative of one or more neuron weight values utilizing the one or more vector quantization index values, dequantize the retrieved one or more vectors to retrieve underlying one or more neuron weight values, and communicate the one or more neuron weight values (620) for processing by the one or more processing components (630) of the neural network environment.

Example Clause P, the computer-readable storage medium of Example Clause O, wherein the instructions further cause the one or more processors of the computing device to: store the one or more vectors in one or more fast lookup tables.

Example Clause Q, the computer-readable storage medium of Example Clause O and P, wherein the instructions further cause the one or more processors of the computing device to: select a length of the one or more vectors.

Example Clause R, the computer-readable storage medium of Example Clauses O through Q, wherein the instructions further cause the one or more processors of the computing device to: retrieve no vectors for a neuron layer of the neural network environment.

Example Clause S, the computer-readable storage medium of Example Clauses O through R, wherein the instructions further cause the one or more processors of the computing device to: perform inline dequantization of the one or more vectors to retrieve the underlying one or more neuron weight values.

Example Clause T, the computer readable medium of Example Clauses O through S, wherein the memory component cooperates with a physical sensor capable of producing input data comprising audio data, video data, haptic sensory data, and other data for subsequent processing by the one or more cooperating processing units.

Example Clause U, the computer readable medium of Example Clauses O through T, wherein the cooperating processing units electronically cooperate with one or more output physical components operative to receive for human interaction processed input data comprising audio data, video data, haptic sensory data and other data.

CONCLUSION

In closing, although the various techniques have been described in language specific to structural features and/or methodological acts, it is to be understood that the subject matter defined in the appended representations is not necessarily limited to the specific features or acts described. Rather, the specific features and acts are disclosed as example forms of implementing the claimed subject matter.

What is claimed is:
1. A system for enhanced data processing in a neural network environment, the system comprising:
at least one processor;
at least one memory component; and
at least one memory in communication with the at least one processor, the at least one memory having com- puter-readable instructions stored thereupon that, when executed by the at least one processor, cause the at least one processor to:
  receive one or more initialization parameters from a cooperating controller component of the neural network environment, the initialization parameters comprising data representative of the dimensions of the data to be processed by the neural network environment and data representative of one or more vector quantization index values, the one or more index values representative of one or more vectors stored on the at least one memory component, the one or more vectors comprising data representative of one or more contiguous segments of one or more neuron weight values;
  convert the one or more contiguous segments into one or more vectors representative of one or more neuron weight values and assigning one or more vector quantization index values to the converted segments and storing the one or more vectors in the at least one memory component;
  retrieve from the at least one memory component the one or more vectors representative of one or more neuron weight values utilizing the one or more vector quantization index values;
  dequantize the retrieved one or more vectors to retrieve underlying one or more neuron weight values; and
  communicate the one or more neuron weight values for processing by the one or more processing components of the neural network environment.

2. The system of claim 1, wherein the one or more vectors are stored in a fast lookup table residing on the at least one memory component.

3. The system of claim 2, wherein the one or more vectors have an arbitrary length.

4. The system of claim 3, wherein the computer-readable instructions further cause the at least one processor to retrieve the one or more vectors from one or more rows of the fast lookup table.

5. The system of claim 4, wherein the vector length of the one or more vectors is selectable for each neuron layer of the neural network environment.

6. The system of claim 5, wherein the computer-readable instructions further cause the at least one processor to perform vector dequantization of one or more neuron weight values for selected one or more of the neuron layers of the neural network environment.

7. The system of claim 2, further comprising one or more hardware components operative to perform a fast lookup of the vectors stored on the fast look up table.

8. A computer-implemented method, comprising:
  receiving one or more initialization parameters from a cooperating controller component of a neural network environment, the initialization parameters comprising data representative of the dimensions of the data to be processed by the neural network environment and data representative of one or more vector quantization index values, the one or more index values representative of one or more vectors stored on the at least one memory component, the one or more vectors comprising data representative of one or more contiguous segments of one or more neuron weight values, the one or more vectors generated by a processor of the neural network environment;
  converting the one or more contiguous segments into one or more vectors representative of one or more neuron weight values and assigning one or more vector quantization index values to the converted segments and storing the one or more vectors in the at least one memory component;
  retrieving from the at least one memory component the one or more vectors representative of one or more neuron weight values utilizing the one or more vector quantization index values, the one or more vectors operatively stored on a fast lookup table;
  dequantizing the retrieved one or more vectors to retrieve underlying one or more neuron weight values; and
  communicating the one or more neuron weight values for processing by the neural network environment.

9. The computer-implemented method of claim 8, further comprising inline dequantization of the one or more retrieved vectors to obtain the one or more neuron weight values by one or more cooperating hardware components of the neural network environment.

10. The computer-implemented method of claim 8, further comprising utilizing a base index in a cooperating memory component for the one or more generated vectors to generate virtualized one or more fast lookup tables.

11. The computer-implemented method of claim 8, further comprising generating one or more vectors for one or more neuron layers of the neural network environment.

12. The computer-implemented method of claim 11, further comprising storing the one or more vectors in one or more rows of a fast lookup table.

13. The computer-implemented method of claim 12, further comprising generating one or more vectors of arbitrary length.

14. The computer-implemented method of claim 8, further comprising selecting a vector length for the generation of the one or more vectors for the neuron layers of the neural network environment.

15. The computer-implemented method of claim 8, further comprising storing the one or more generated vectors in a local memory component.

16. A computer-readable storage medium having computer-executable instructions stored thereupon which, when executed by one or more processors of a computing device, cause the one or more processors of the computing device to:
  receive one or more initialization parameters from a cooperating controller component of a neural network environment, the initialization parameters comprising data representative of the dimensions of the data to be processed by the neural network environment and data representative of one or more vector quantization index values, the one or more index values representative of one or more vectors stored on the at least one memory component, the one or more vectors comprising data representative of one or more contiguous segments of one or more neuron weight values;
  convert the one or more contiguous segments into one or more vectors representative of one or more neuron weight values and assigning one or more vector quantization index values to the converted segments and storing the one or more vectors in the at least one memory component;
  retrieve from the at least one memory component the one or more vectors representative of one or more neuron weight values utilizing the one or more vector quantization index values;
  dequantize the retrieved one or more vectors to retrieve underlying one or more neuron weight values; and
  communicate the one or more neuron weight values for processing by one or more processing components of the neural network environment.

17. The computer-readable storage medium of claim 16, wherein the instructions further cause the one or more processors of the computing device to:
   store the one or more vectors in one or more fast lookup tables.

18. The computer-readable storage medium of claim 17, wherein the instructions further cause the one or more processors of the computing device to:
   select a length of the one or more vectors.

19. The computer-readable storage medium of claim 16, wherein the instructions further cause the one or more processors of the computing device to:
   retrieve no vectors for a neuron layer of the neural network environment.

20. The computer-readable storage medium of claim 16, wherein the instructions further cause the one or more processors of the computing device to:
   perform inline dequantization of the one or more vectors to retrieve the underlying one or more neuron weight values.

21. The computer readable medium of claim 16, wherein the memory component cooperates with a physical sensor capable of producing input data comprising audio data, video data, haptic sensory data, and other data for subsequent processing by the one or more processing components.

22. The computer readable medium of claim 21, wherein the cooperating processing units electronically cooperate with one or more output physical components operative to receive for human interaction processed input data comprising audio data, video data, haptic sensory data and other data.

* * * * *